(12) United States Patent
Richter et al.

(10) Patent No.: US 7,985,668 B1
(45) Date of Patent: Jul. 26, 2011

(54) METHOD FOR FORMING A METAL SILICIDE HAVING A LOWER POTENTIAL FOR CONTAINING MATERIAL DEFECTS

(75) Inventors: Ralf Richter, Dresden (DE); Torsten Huisinga, Dresden (DE); Jens Heinrich, Wachau (DE)

(73) Assignee: Globalfoundries Inc., Grand Cayman (KY)

( * ) Notice: Subject to any disclaimer, the term of this patent is extended or adjusted under 35 U.S.C. 154(b) by 0 days.

(21) Appl. No.: 12/948,463

(22) Filed: Nov. 17, 2010

(51) Int. Cl.
*H01L 21/00* (2006.01)

(52) U.S. Cl. ........ 438/583; 438/649; 438/655; 438/682; 257/768

(58) Field of Classification Search .................. 438/583, 438/649, 682, 655; 257/768
See application file for complete search history.

(56) References Cited

U.S. PATENT DOCUMENTS

| | | | |
|---|---|---|---|
| 4,877,755 A * | 10/1989 | Rodder | 438/586 |
| 5,633,036 A * | 5/1997 | Seebauer et al. | 427/126.5 |
| 5,646,070 A * | 7/1997 | Chung | 438/644 |
| 6,767,796 B2 * | 7/2004 | Tanaka et al. | 438/299 |
| 6,838,363 B2 | 1/2005 | Wieczorek et al. | |
| 7,517,795 B2 | 4/2009 | Carruthers et al. | |
| 2003/0006504 A1 * | 1/2003 | Maekawa et al. | 257/751 |
| 2004/0087121 A1 * | 5/2004 | Kammler et al. | 438/528 |

OTHER PUBLICATIONS

Mann and Clevenger, "The C49 to C54 Phase Transformation in TiSi2 Thin Films," J. Electrochem. Soc., 141:1347-50, May 1994.
Saraswat, "Polycides, Salicides and Metals Gates" Presentation, Apr. 28, 2005.

* cited by examiner

*Primary Examiner* — Jarrett J Stark
*Assistant Examiner* — Nicholas Tobergte
(74) *Attorney, Agent, or Firm* — Williams, Morgan & Amerson, P.C.

(57) ABSTRACT

Generally, the present disclosure is directed to a method of removing "weakened" areas of a metal silicide layer during silicide layer formation, thereby reducing the likelihood that material defects might occur during subsequent device manufacturing. One illustrative embodiment includes depositing a first layer of a refractory metal on a surface of a silicon-containing material, and performing first and second heating processes. The method further comprises performing a cleaning process, depositing a second layer of the refractory metal above the silicon-containing material, and performing a third heating process.

18 Claims, 5 Drawing Sheets

METHOD FOR FORMING A METAL SILICIDE HAVING A LOWER POTENTIAL FOR CONTAINING MATERIAL DEFECTS

BACKGROUND OF THE INVENTION

1. Field of the Invention

Generally, the present invention relates to the fabrication of integrated circuits, and, more particularly, to the formation of metal silicide regions having a lower potential for containing material related defects on silicon-containing circuit elements.

2. Description of the Related Art

In modern ultra-high density integrated circuits, device features have been steadily decreasing in size to enhance the performance of the semiconductor device and the overall functionality of the circuit. However, commensurate with the on-going shrinkage of feature sizes, certain size-related problems arise that may at least partially offset the advantages that may be obtained by simple size reduction alone. Generally speaking, decreasing the size of, for instance, circuit elements such as MOS transistors and the like, may lead to superior performance characteristics due to a decreased channel length of the transistor element, thereby resulting in higher drive current capabilities and enhanced switching speeds. Upon decreasing the channel length of transistor elements, however, the electrical resistance of conductive lines and contact regions—e.g., those regions that provide electrical contact to the transistor elements—becomes a significant issue in the overall transistor design, since the cross-sectional area of these lines and regions is similarly decreased. However, the cross-sectional area of the conductive lines and contact regions, together with the characteristics of the materials they comprise, may have a significant influence on the effective electrical resistance of these circuit elements.

Furthermore, as integrated circuits become smaller and more closely spaced—i.e., as the number of circuit elements that are packed within a given unit area of a semiconductor device substrate increases—the greater the number of interconnections that are required between these circuit elements. Moreover, it is not uncommon for the number of required interconnects to increase in a non-linear fashion relative to the number of circuit elements, such that the amount of "real estate" available for interconnects becomes even further limited, thus increasing the likelihood that the cross-sectional area of critical conductive elements might be further reduced.

Presently, the majority of integrated circuits are silicon-based, that is, most of the circuit elements comprise silicon-containing regions which act as conductive areas. These silicon-containing regions may be in crystalline, polycrystalline and/or amorphous form, and they may doped and/or undoped, as may be required for the specific conductivity of the specific circuit element. One illustrative example in this context is that of a gate electrode of a MOS transistor element, which may be considered as a polysilicon line. Upon application of an appropriate control voltage to the gate electrode, a conductive channel is formed proximate the interface of a thin gate insulation layer and an active region of the semiconducting substrate. Although the design step of reducing the feature size of a transistor element tends to improve device performance, due to the reduced channel length, the commensurate shrinking of the gate electrode may otherwise result in significant delays in the propagation of the signal along the gate electrode, i.e., the formation of the channel through the entire width of the gate electrode. Moreover, the issue of signal propagation delay is further exacerbated for polysilicon lines connecting to individual circuit elements or to different active regions within the device. Therefore, it is particularly important to improve the sheet resistance of polysilicon lines and other silicon-containing contact regions so as to allow further device scaling without compromising overall device performance. For this reason, and depending upon the device design requirements, it has become commonplace to reduce the sheet resistance of polysilicon lines and silicon contact regions by forming a metal silicide in and on appropriate portions of the respective silicon-containing regions.

With reference to FIGS. 1a-1e, one illustrative prior art process flow for forming a representative metal silicide on a corresponding portion of an MOS transistor element will now be described.

FIG. 1a schematically shows a cross-sectional view of an illustrative transistor element 100, such as a MOS transistor, that is formed on a substrate 101 including a silicon-containing active region 102. The active region 102 is typically enclosed by an isolation structure 103, which in the present example is provided in the form of a shallow trench isolation usually used for sophisticated integrated circuits. Highly doped source and drain regions 104, including extension regions 105 that usually comprise a dopant concentration less than the highly doped regions 104, are formed in the active region 102. The source and drain regions 104, including the extension regions 105, are laterally separated by a channel region 106. A gate insulation layer 107 electrically and physically isolates a gate electrode 108 from the underlying channel region 106. Spacer elements 109 are formed on sidewalls of the gate electrode 108. A refractory metal layer 110 is formed over the transistor element 100 with a thickness required for the further processing in forming metal silicide portions.

A typical conventional process flow for forming the transistor element 100, as shown in FIG. 1a, may include the following steps. After defining the active region 102 by forming the shallow trench isolations 103 by means of advanced photolithography and etch techniques, well-established and well-known implantation steps are carried out to create a desired dopant profile in the active region 102 and the channel region 106.

Subsequently, the gate insulation layer 107 and the gate electrode 108 are formed by sophisticated deposition, photolithography and anisotropic etch techniques to obtain a desired gate length, which is the horizontal extension of the gate electrode 108 in FIG. 1a, i.e., in the plane of the drawing of FIG. 1a. Thereafter, a first implant sequence may be carried out to form the extension regions 105 wherein, depending on design requirements, additional so-called halo implants may be performed.

The spacer elements 109 are then formed by depositing a dielectric material, such as silicon dioxide and/or silicon nitride, and patterning the dielectric material by an anisotropic etch process. Thereafter, a further implant process may be carried out to form the heavily doped source and drain regions 104.

Subsequently, the refractory metal layer 110 is deposited on the transistor element 100 by, for example, chemical vapor deposition (CVD) or physical vapor deposition (PVD). Preferably, a refractory metal, such as titanium, cobalt, nickel and the like, is used for the refractory metal layer 110. As it turns out, however, that the characteristics of the various refractory metals, both during the steps of forming a metal silicide, as well as after the metal silicide has been completely formed, vary significantly from each other. Consequently, selecting an appropriate refractory metal depends on the further design parameters of the transistor element 100, as well as on the process steps designed to be performed in any subsequent manufacturing processes. Following are some considerations to be evaluated in selecting the appropriate refractory metal used for forming the desired metal silicide.

At present, MOS transistor technology makes use of metal silicides having a low sheet resistance to form contact elements in the silicon-based regions of transistor devices such as source/drain regions, gate electrode structures, and the like. Typically, the formation of metal silicides is integrated into the MOS manufacturing process using a "self-aligned silicide," or "salicide" process, which comprises steps of a depositing a layer of a refractory metal, such as titanium, cobalt, nickel, and the like, over a silicon-based semiconductor material, and thereafter performing at least one heating process. Depending on the type of metal silicide that is being formed, the heating process may consist of two, or even more, separate heating steps, during which a chemical reaction is induced between the refractory metal and the silicon in the silicon-based semiconductor material, thereby forming the metal silicide.

Examples of metal silicides having a low sheet resistance that are commonly used as contact regions in MOS devices include $CoSi_2$ (cobalt disilicide), the C54 phase of $TiSi_2$ (titanium disilicide), and NiSi (nickel monosilicide), which have thin film resistivities in the range of approximately 14-20 $\mu\Omega cm$, 13-16 $\mu\Omega cm$, and 14-20 $\mu\Omega cm$, respectively.

During the typical heating process used to form a low resistivity cobalt or C54 phase titanium disilicide, a first low-temperature heating step is performed, on the order of about 400° C. This first heating step results in the formation of a first silicide phase, i.e., the C49 phase of $TiSi_2$, or CoSi (cobalt monosilicide). However, these silicide phases of titanium and cobalt have thin film resistivities in the range of approximately 60-70 $\mu\Omega cm$ and 100-150 $\mu\Omega cm$, respectively, which are significantly higher than the sheet resistances previously noted for cobalt disilicide the C54 phase of titanium disilicide. Therefore, after any non-reacted refractory metal is removed from the contact regions using a selective wet etching process, a second higher-temperature heating step is performed, i.e., at temperatures in the range of 600°-700° C. During this second higher-temperature heating step, the undesirable high-resistance silicides are transformed into the desirable low-resistance phases noted above.

During a typical heating process used to form low resistivity nickel monosilicide, a similar first low-temperature heating step is performed, in the range of approximately 300°-400° C. However, while desirable low resistivity nickel monosilicide is formed during the first heating step, some areas of nickel disilicide are also formed. Nickel disilicide has a somewhat higher resistivity than nickel monosilicide, on the order of 40-50 $\mu\Omega cm$. Therefore, after any non-reacted nickel is selectively removed from the contact regions by performing an etching process, a second low-temperature heating step is performed, again at a temperature of about 300°-400° C., thereby converting the high-resistivity nickel disilicide to the more desirable low-resistivity nickel monosilicide.

While the type of metal silicides used for a given contact region may depend on specific device requirements, nickel monosilicide provides some distinct advantages over cobalt and titanium disilicides. For example, nickel monosilicide contacts are typically thinner than the conventional titanium or cobalt silicide contacts, therefore less silicon base material is consumed during the silicide conversion process. Moreover, as noted above, a lower temperature second heating step is typically used and/or may be required for forming nickel monosilicide as compared to forming cobalt and titanium disilicides, thereby necessitating a lower overall thermal budget.

Therefore, for highly sophisticated transistor elements, nickel is increasingly considered as an appropriate substitute for both cobalt and titanium. Accordingly, it is therefore assumed in the following description that the refractory metal layer 110 is substantially comprised of nickel. In some embodiments, the refractory metal layer may also comprise platinum, which in some cases may promote a more homogeneous formation of nickel monosilicide.

After deposition of the refractory metal layer 110, a first heat treatment step 115 is carried out to initiate a chemical reaction between the nickel atoms in the layer 110 and the silicon atoms in those areas of the source and drain regions 104 and the gate electrode 108 that are in contact with the nickel. For example, a rapid thermal heating process may be carried out using a temperature in the range of approximately 300-400° C., and for a time period of approximately 30-90 seconds. During the first heat treatment step 115, silicon and nickel atoms diffuse and combine to form layers of nickel silicide, which comprise regions of nickel monosilicide and regions of nickel disilicide.

FIG. 1b schematically shows the transistor element 100 with correspondingly formed nickel silicide layers 111 in the source and drain regions 104, and a nickel silicide layer 112 formed in the gate electrode 108. Nickel silicide layers 111 and 112 each comprise monosilicide regions 113 and disilicide regions 114. A respective thickness 111a and 112a of the nickel silicide layers 111, 112 may be adjusted by process parameters, such as a thickness of the initial refractory metal layer 110 and/or the specified conditions during the heat treatment. For example, the refractory metal layer 110 may be deposited with a specified thickness, and the temperature and/or the duration of the heat treatment correspondingly adjusted so that substantially the entire refractory metal layer 110 is converted into nickel silicide. Alternatively, the refractory metal layer 110 is deposited with a sufficient thickness and the degree of nickel silicide generation is controlled by the temperature and/or the duration of the heat treatment.

Irrespective of the manner in which thicknesses 111a, 112a are controlled, the non-reacted nickel material from refractory metal layer 110 is then selectively removed by an etch process 116, such as a wet etch process, of which suitable recipes are well known in the art. It should be noted that the silicon material contained in the sidewall spacer elements 109 and the shallow trench isolations 103 does not substantially take part in the chemical reaction induced during the first heat treatment step 115, as it is present in those features only as a thermally stable silicon dioxide and/or silicon nitride. Finally, in those instance where the refractory metal layer 110 also comprises platinum to facilitate silicide formation, the etch process 116 may include a second etch step based on, for example, an etch recipe comprising aqua regia, to remove any residual platinum metal remaining on the exposed surfaces of transistor 100.

FIG. 1c schematically shows the transistor element 100 in a further advanced manufacturing stage, after all non-reacted nickel and any residual platinum, if any, from the refractory metal layer 110 has been removed during the etch process 116, and after the transistor element 100 has been further exposed to a second heat treatment step 117. During the second heat treatment step 117, regions of nickel disilicide 114 present in the nickel silicide layer 111, 112 are converted to nickel monosilicide regions 118. The second heat treatment step 117 may comprise a rapid heating cycle similar to that performed for the first heat treatment step 115, i.e., at a temperature in the range of approximately 300-400° C., for approximately 30-90 seconds.

It should be noted that the converted nickel monosilicide regions 118, which have been transformed from nickel disilicide regions 114 during the second heat treatment step 117, are "weakened" areas of the silicide layers 111, 112 wherein material defects or other material damage may manifest during subsequent device processing, as illustrated in FIG. 1*d* and described below.

After the second heat treatment step 117 has been completed, wherein most of the nickel disilicide material regions 114 initially present in the nickel silicide layers 111, 112, has been converted to nickel monosilicide regions 118, an interlayer dielectric material 119 may be formed above the transistor 100. Thereafter, as shown in FIG. 1*d*, an anisotropic etch process 120, such as a reactive ion etch (RIE) process and the like, may be performed on the basis of an appropriately patterned etch mask layer (not shown) so as to form a contact via 121 in the interlayer dielectric material 119, thereby exposing one or more contact regions of the nickel silicide layers 111, 112. However, due to the thermal budget of approximately 400° C. attributable to the deposition of interlayer dielectric material 119, a small fraction of any nickel disilicide material regions 114 remaining in the nickel silicide layer 111, 112 after the second heat treatment step 117 may also be converted to regions of nickel monosilicide regions 118, thereby forming additional "weakened" areas of the silicide layers 111, 112. During the subsequent anisotropic etch process 120, the "weakened" areas of the silicide layers 111, 112—i.e., the converted nickel monosilicide regions 118—may be preferentially etched away, thereby leaving voids or "holes" 122 in the nickel silicide layers 111, 112.

FIG. 1*e* illustrates a further advanced manufacturing stage of the transistor element 100, wherein a conductive metal layer 123, such as tungsten, copper, and the like, is formed above the interlayer dielectric material 119. The conductive metal layer 123 fills the contact via 121, forming a conductive contact element that provides an electrical connection between the metallization layers (not shown) subsequently formed above the interlayer dielectric material 119 and the contact regions represented by nickel silicide layers 111, 112. Due to the material defects—i.e., "holes" 122—present in the nickel silicide layers 111, 112, the likelihood that a contact "punch through" 124 might occur at the material defect location 122 is substantially increased. As illustrated in FIG. 1*e*, a contact "punch through" 124 may occur when, during deposition of the conductive metal 123, the contact element "punches through" the nickel silicide layer and into the highly doped source/drain region 104, and/or gate electrode 108, at the locations of the "holes" 122. Due to the contact "punch through" 124 that may be created at the "holes" 122, a higher resistivity contact may sometimes be obtained, and the possibility of contact-to-well current leakage may also increase. The resulting consequences that can generally be attributed to these defects is a commensurate reduction in device reliability and/or decrease in yield expectations, which may in some cases be as high as 10%.

In view of the quality and reliability concerns cited above, it would therefore be highly desirable to eliminate or at least reduce some of the problems generally associated with forming nickel silicide contact regions in highly sophisticated integrated circuit devices. The present disclosed subject matter is therefore directed to methods for forming silicide regions that may reduce one or more of the problems identified herein.

SUMMARY OF THE DISCLOSURE

The following presents a simplified summary of the present disclosure in order to provide a basic understanding of some aspects disclosed herein. This summary is not an exhaustive overview of the disclosure, nor is it intended to identify key or critical elements of the subject matter disclosed here. Its sole purpose is to present some concepts in a simplified form as a prelude to the more detailed description that is discussed later.

Generally, the present disclosure is directed to a method of removing "weakened" areas of a metal silicide layer during silicide layer formation, thereby reducing the likelihood that material defects might occur during subsequent device manufacturing. In one illustrative embodiment, a novel method for forming a metal silicide region is disclosed comprising depositing a first layer of a refractory metal on a surface of a silicon-containing semiconductor material, and performing first and second thermal annealing processes. The method further comprises performing a cleaning process, depositing a second layer of the refractory metal above the silicon-containing semiconductor material, and performing a third thermal annealing process.

In another illustrative embodiment, a method comprises forming an initial metal silicide layer comprising a refractory metal in a contact area of a semiconductor device and creating voids in the initial metal silicide layer by performing a furnace annealing process followed by a wet etching process to remove material defects from the initial metal silicide layer. The method further comprises depositing a layer of the refractory metal above the contact area to cover the initial metal silicide layer and fill the voids, initiating a chemical reaction between the layer of refractory metal and silicon in the contact area of the semiconductor device to form a final metal silicide layer in the contact area, and removing unreacted material of the layer of the refractory metal.

BRIEF DESCRIPTION OF THE DRAWINGS

The disclosure may be understood by reference to the following description taken in conjunction with the accompanying drawings, in which like reference numerals identify like elements, and in which.

Figure 1A:
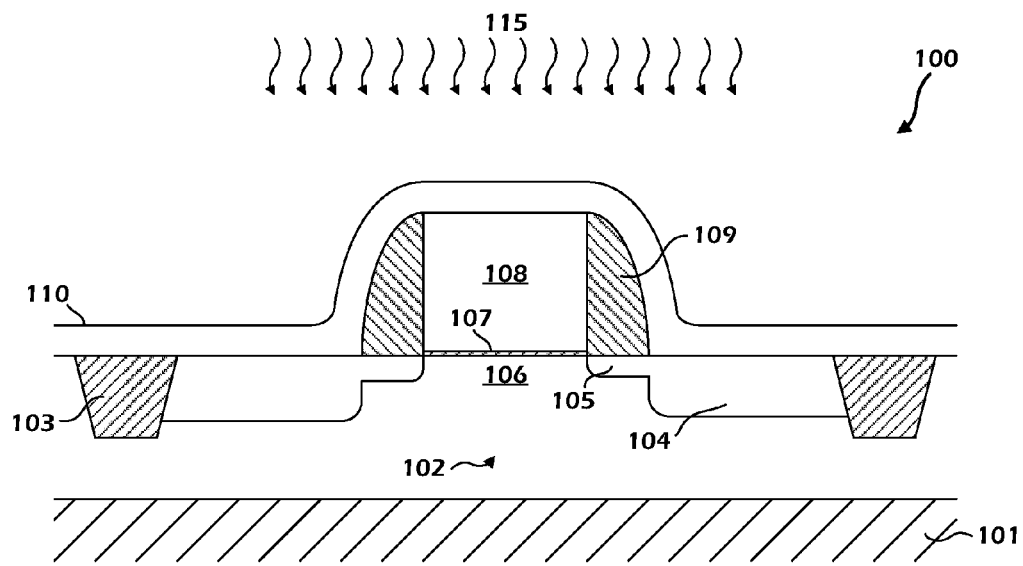
FIGS. 1*a*-1*e* schematically illustrate a process flow of one illustrative prior art method for forming metal silicide contact regions of a semiconductor device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the present subject matter are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In general, the present disclosure is directed to forming metal silicide contact regions on a silicon-containing structure, such as a semiconductor device, and to devices incorporating such regions. As will be readily apparent to those skilled in the art upon a complete reading of the present application, while reference is generically made throughout the application to MOS—i.e., metal-oxide-semiconductor—transistor elements, the presently disclosed methods are applicable to a variety of technologies, e.g., NMOS, PMOS, CMOS, etc., and is readily applicable to a variety of devices, including, but not limited to, logic devices, memory devices, resistors, conductive lines, etc.

It should be noted that in the following illustrative embodiments, a field effect transistor, such as a MOS transistor element, is discussed to demonstrate the principle of improving the conductivity of silicon-containing conductive regions by enhancing the thermal stability of a metal silicide formed in those regions. The present disclosure is not limited to such an example and it may, however, be readily applied to any silicon-containing regions, for example, provided in the form of doped or undoped crystalline silicon, doped or undoped polycrystalline silicon and doped or undoped amorphous silicon, irrespective of the type of circuit element of interest. For example, any polysilicon lines or areas connecting adjacent circuit elements, such as transistors, resistors, capacitors and the like, or connecting different chip areas, as well as certain silicon-containing portions of any type of circuit elements, for example, electrodes of capacitors, contact portions of resistors and the like, are to be understood to be encompassed by the present disclosure and should be considered as represented by the silicon-containing conductive region included in the transistor element described with reference to FIGS. 2a-2e in the following illustrative embodiments.

It should be noted that, where appropriate, the reference numbers used in describing the various elements illustrated in FIGS. 2a-2e substantially correspond to the reference numbers used in describing the corresponding elements illustrated in FIGS. 1a-1e above, except that the leading numeral has been changed from a "1" to a "2." For example, transistor element "100" corresponds to transistor element "200," gate electrode "108" corresponds to gate electrode "208," and so on. Accordingly, the reference number designations used to identify some elements of the presently disclosed subject matter may be illustrated in the FIGS. 2a-2e, but may not be specifically described in the following disclosure. In those instances, it should be understood that the numbered elements shown in FIGS. 2a-2e which are not described in detail below substantially correspond with their like-numbered counterparts illustrated in FIGS. 1a-1e, and described in the associated disclosure set forth above.

Figure 1B:
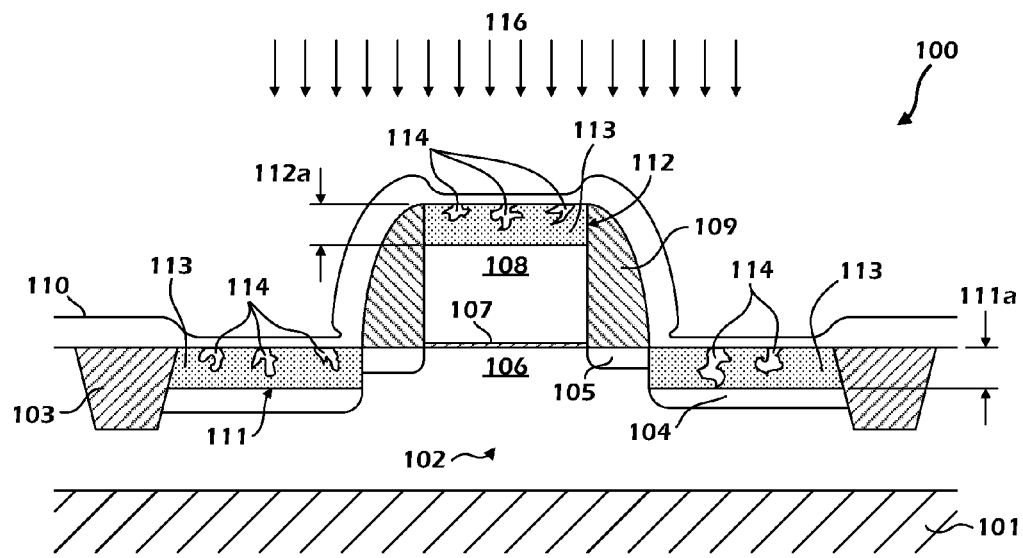
Figure 1C:
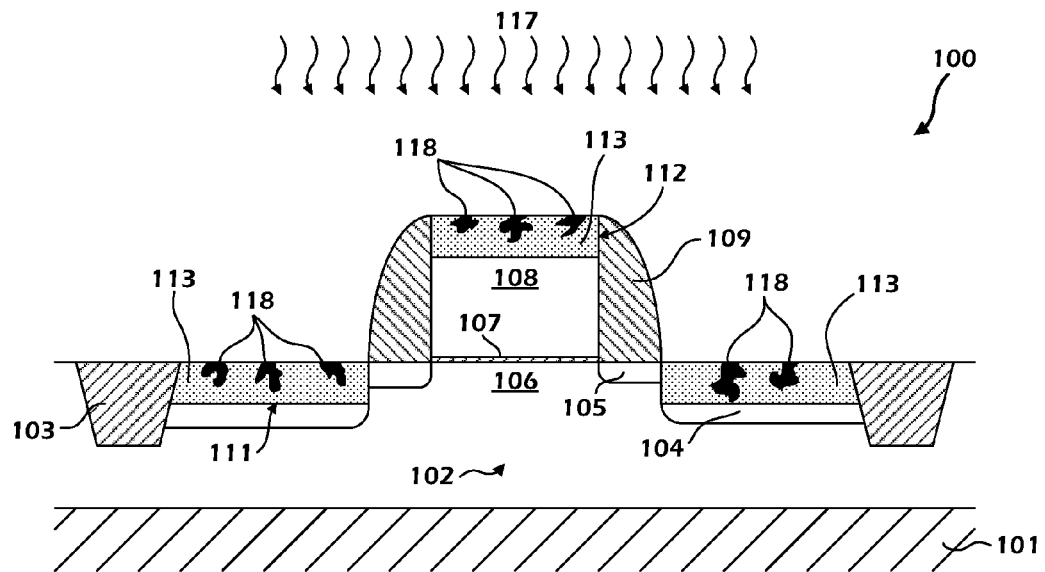
Figure 1D:
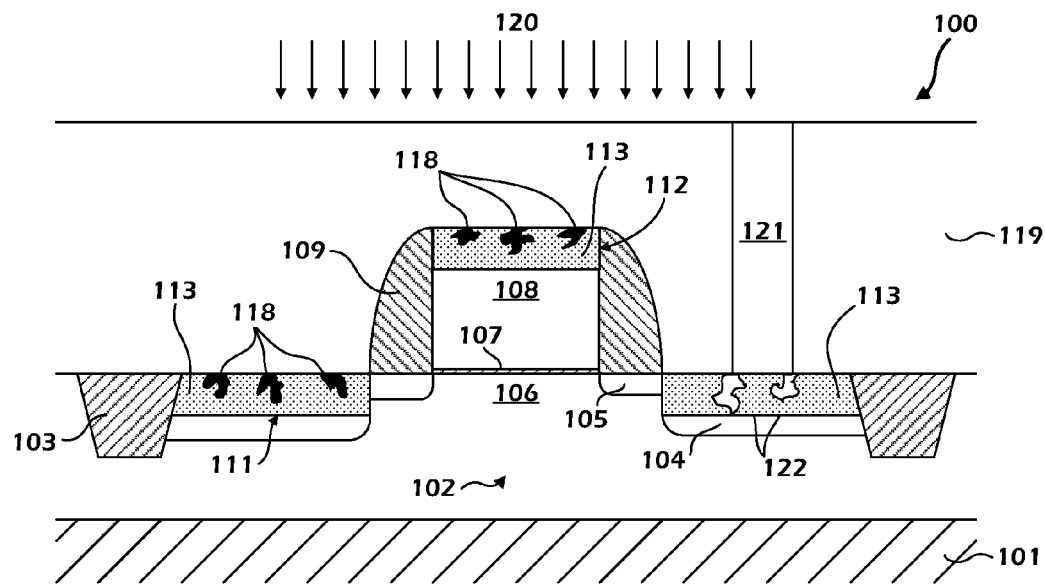
Figure 1E:
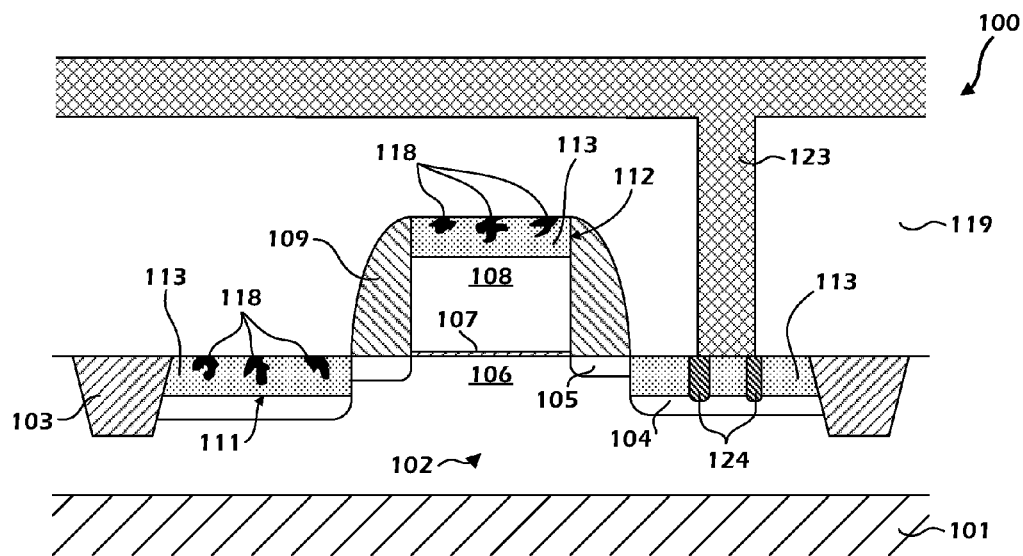
Figure 2A:
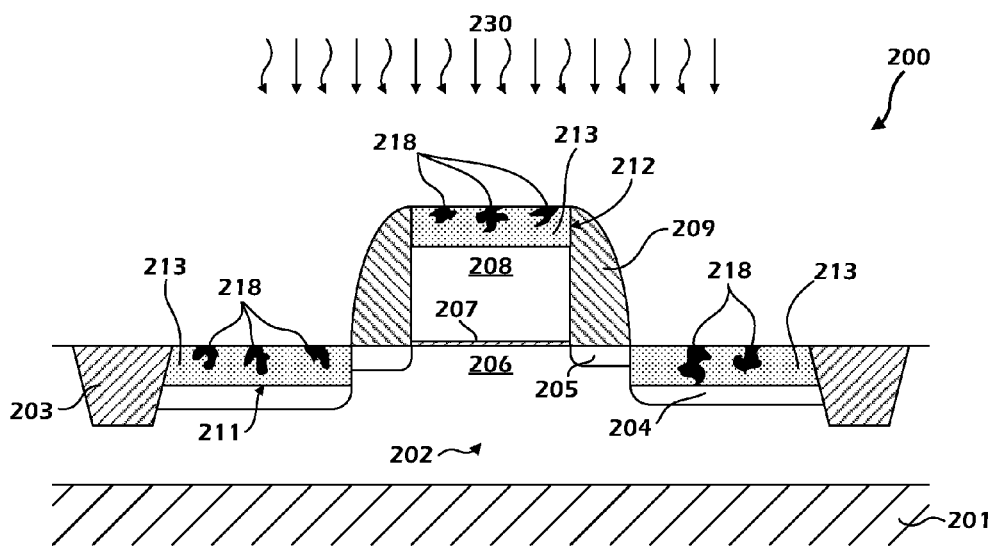
FIGS. 2*a*-2*e* schematically illustrate a process flow of an illustrative embodiment of the subject matter disclosed herein.

FIG. 2a shows a schematic cross-sectional view of a transistor element 200 that substantially corresponds to the manufacturing stage of transistor element 100 as illustrated in FIG. 1c and described above. The transistor element of FIG. 2a includes a substrate 201, which may be a silicon substrate or any other appropriate substrate comprising a semiconducting active region 202 defined by an isolation structure 203, such as a shallow trench isolation. A gate electrode 208 is formed above the active region 202, and is separated from the active region 202 by a gate insulation layer 207. In one or more illustrative embodiments, the gate electrode 208 may be comprised of polysilicon. Furthermore, one or more sidewall spacers 209 may be formed on the sidewalls of the gate electrode 208. As described with respect to transistor element 100 above, the sidewall spacers 209 may be comprised of, for example, silicon dioxide, silicon nitride or any other appropriate material, wherein the thickness of the spacers 209 is selected in accordance with the specific process requirements and design considerations of the finished semiconductor device.

A typical process flow for forming the illustrative transistor element 200, as shown in FIG. 2a, may be as follows. After formation of the shallow trench isolations 203, implant steps may be carried out (not shown) to define a required dopant profile in the active region 202. Thereafter, a layer of gate dielectric material may be formed by first growing and/or depositing an appropriate dielectric material, such as silicon dioxide, silicon nitride, silicon oxynitride or any combination thereof. In some highly sophisticated semiconductor devices, the gate dielectric material may comprise a high-k dielectric, i.e., a material having a dielectric constant greater than 10. Then, a layer of polysilicon material is deposited above the substrate and the gate insulation layer and the polysilicon material layer may be patterned by sophisticated photolithography and anisotropic etch techniques to form the gate insulation layer 207 and the gate electrode 208.

As previously described with respect to transistor 100, a first implant sequence may then be performed to form the source/drain extension regions 205. A layer of dielectric material, such as silicon dioxide and/or silicon nitride, may then deposited above the transistor 200, and the dielectric material may thereafter be patterned by an appropriately designed anisotropic etch process so as to form sidewall spacers 209. A further implant process may then be performed so as to form the heavily doped source and drain regions 204. Thereafter, as illustrated by FIGS. 1a-1c and described in detail above, a layer of refractory metal, such as nickel or nickel-platinum, may then be formed above the transistor 200, followed by a first heating step, an etch/cleaning step, and a second heating step, thereby forming nickel silicide layers 211 in the source/drain regions of transistor 200, and nickel silicide layer 212 in gate electrode 208. Also, as shown for transistor 100 in FIG. 1c, nickel silicide layers 211 and 212 comprise regions of nickel monosilicide 213 and regions of converted nickel monosilicide 218.

As further illustrated in FIG. 2a, a cleaning process 230 may then be performed to prepare the transistor element 200 for further processing. In some illustrative embodiments, the cleaning process 230 may comprise a first tempering or heating step, followed by a second etching step. The first tempering step is performed so as to purposefully "weaken" regions of converted nickel monosilicide 218, so that these "weakened" regions can be substantially removed from the nickel silicide layers 211, 212 by the subsequently performed second etching step. In this way, the presence of "weakened" regions which might lead to material defects or other material damage during subsequent device process might be substantially avoided, thereby reducing the likelihood of, or even substantially avoiding, the problem of contact "punch through" as previously discussed.

The first tempering step of the cleaning process 230 may be, in some illustrative embodiments, a rapid thermal annealing (RTA) process, whereas in other illustrative embodiments, the first tempering step may comprise a furnace heating process. However, irrespective of the type of tempering step used in the cleaning process 230, it may typically be performed under the time and temperature conditions as would be necessary to sufficiently "weaken" the converted nickel monosilicide regions 218 so as to render them susceptible to removal during the subsequent second etching step. To that end, appropriate test data can be generated in order to ascertain when a given converted monosilicide region might be sufficiently "weakened," or when further weak spots might be formed during the conversion of any remaining nickel disilicide regions to nickel monosilicide, which might then be removed by a subsequent etching step. Appropriate test data may include, for example, a variety of pertinent material parameters, such as silicide thicknesses, refractory metal type and concentration, dopant concentration, substrate composition, and the like. Other appropriate test data may include tempering time, tempering temperature, type of tempering employed (i.e., RTA vs. furnace heating), and the type of etching process used.

For example, one illustrative cleaning process may comprise a first tempering step of a furnace heating process, performed at approximately 400° C. for approximately 30 minutes, which might substantially represent the thermal budget attributed to the interlayer dielectric material deposition steps discussed previously. The first tempering step may then be followed by a wet etch step based on a suitable etch recipe, such a solution comprising acidic peroxide and the like. It should be noted that the above example should not be considered by way of limitation, but on the contrary is intended to be illustrative only, and any other cleaning process appropriately designed to "weaken" and facilitate removal of the converted nickel silicide regions should be considered within the spirit and scope of the present disclosure.

Figure 2B:
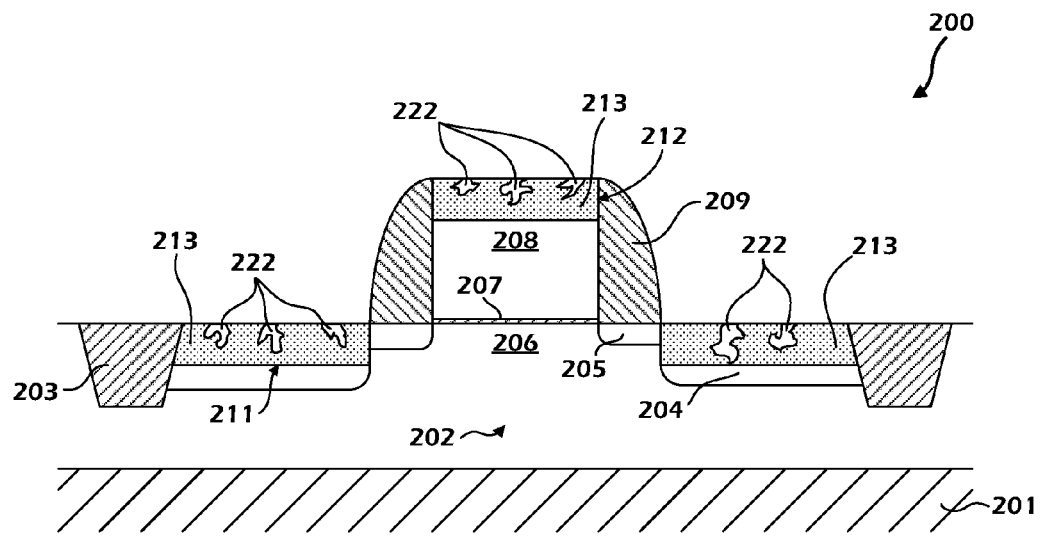

FIG. 2b schematically illustrates the above-described transistor 200 in a further advance manufacturing stage, after completion of the cleaning process 230. As shown in FIG. 2b, nickel silicide layers 211, 212 now contain intentionally created voids or "holes" 222 where regions of converted nickel monosilicide regions 218 were "weakened" during the first tempering step of the cleaning process 230 and subsequently removed by the second etching step. It should be noted that the "holes" 222 may be similar in size and shape to the "holes" 122 previously described in conjunction with FIG. 1d above. However, unlike the inadvertently formed "holes" 122 of the prior art process, the "holes" 222 are intentionally created in the currently disclosed method, and can subsequently be "repaired," as will be described with respect to FIGS. 2c-2e in detail below.

Figure 2C:
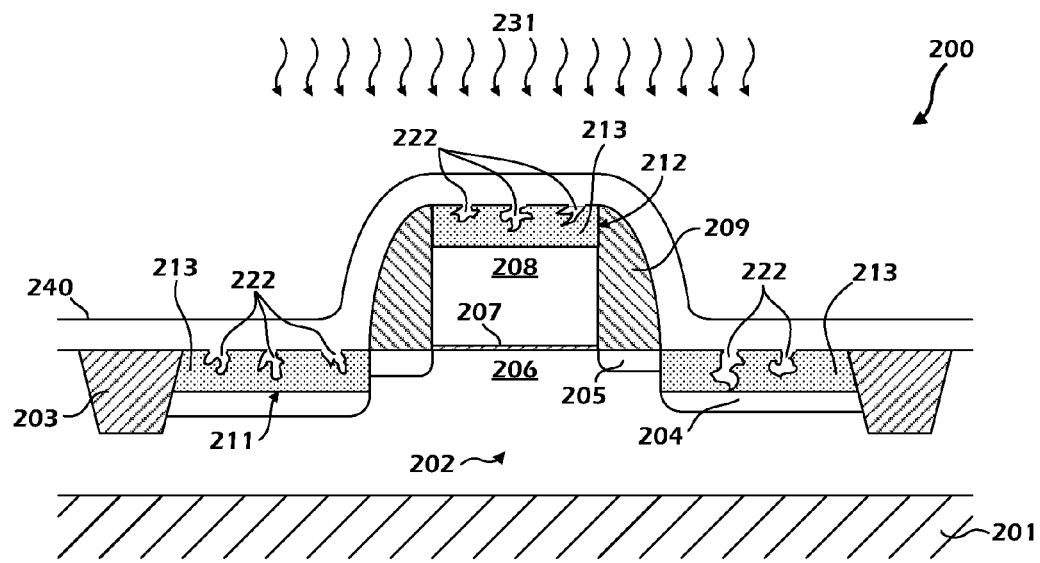

FIG. 2c schematically illustrates the transistor 200 in yet a further advanced manufacturing stage, wherein a second refractory metal layer 240 is deposited above the transistor 200, covering at least metal silicide layers 211, 212 and sidewall spacers 209. The as-deposited thickness of layer 240 may be adjusted depending upon the overall device requirements and the desired final thickness of the metal silicide layers, and in one illustrative embodiment may range between 5-20 nm. The second refractory metal layer 240 may comprise nickel in one illustrative embodiment, whereas in other illustrative embodiments of the present disclosure, the second refractory metal layer 240 may comprise both nickel and platinum, the platinum in some cases promoting better and more homogeneous silicide formation.

Figure 2D:
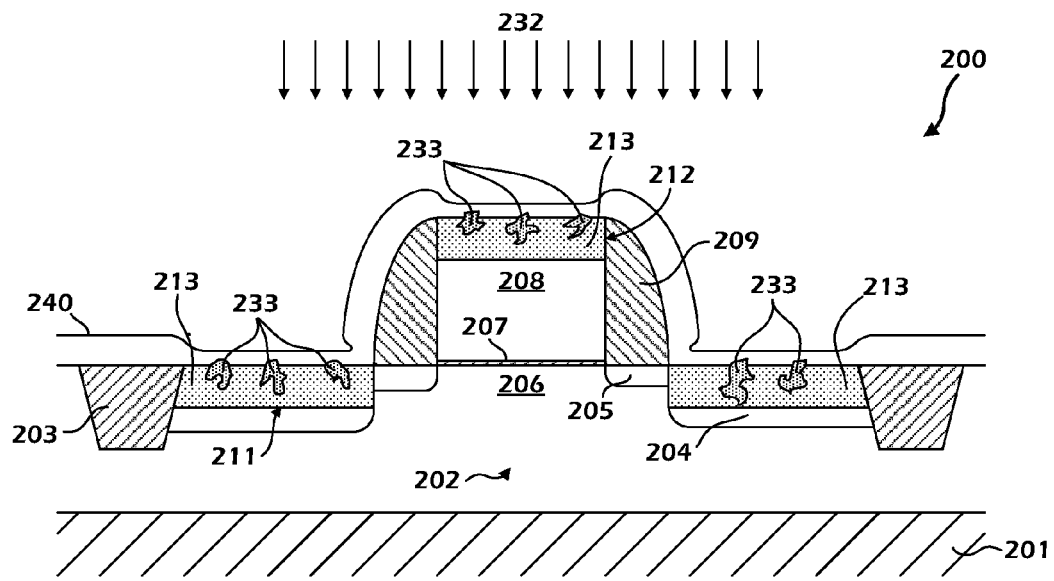

As shown in FIG. 2c, during the deposition of the second refractory metal layer 240, the refractory metal fills the "holes" 222 that were intentionally created during the previously described cleaning process 230. The transistor 200 is thereafter subjected to a third heating step 231, such as an RTA process, during which yet another chemical reaction is induced between the nickel atoms of layer 240 and the silicon atoms in those areas of the source and drain regions 204 and the gate electrode 208 that are in contact with layer 240, thereby forming nickel monosilicide regions 233 in layers 211 and 212, as illustrated in FIG. 2d. However, unlike the converted nickel monosilicide regions 218 formed during the previously performed second heating process (see FIG. 2a), newly formed nickel monosilicide regions 233 (see FIG. 2d) are not "weakened" areas of the silicide layers 211, 212 that may be susceptible inducing material defects or other material damage during subsequent device processing. Accordingly, the likelihood of contact "punch through" and the associated decreased yield expectations and/or device reliability may therefore be significantly reduced.

FIG. 2d schematically depicts transistor 200 in a further illustrative manufacturing stage, after the third heating step 231 has been completed and the nickel monosilicide regions 233 have been formed. As shown in FIG. 2d, a selective etch process 232, such as a wet etch isotropic etch, is performed to strip any non-reacted nickel material of layer 240 from above the transistor 200. In those illustrative embodiments wherein the layer 240 also comprises platinum, the selective etch process 232 may include, for example, an aqua regia treatment step so as to remove any residual platinum metal that might remain on the exposed surfaces of transistor 200.

Figure 2E:
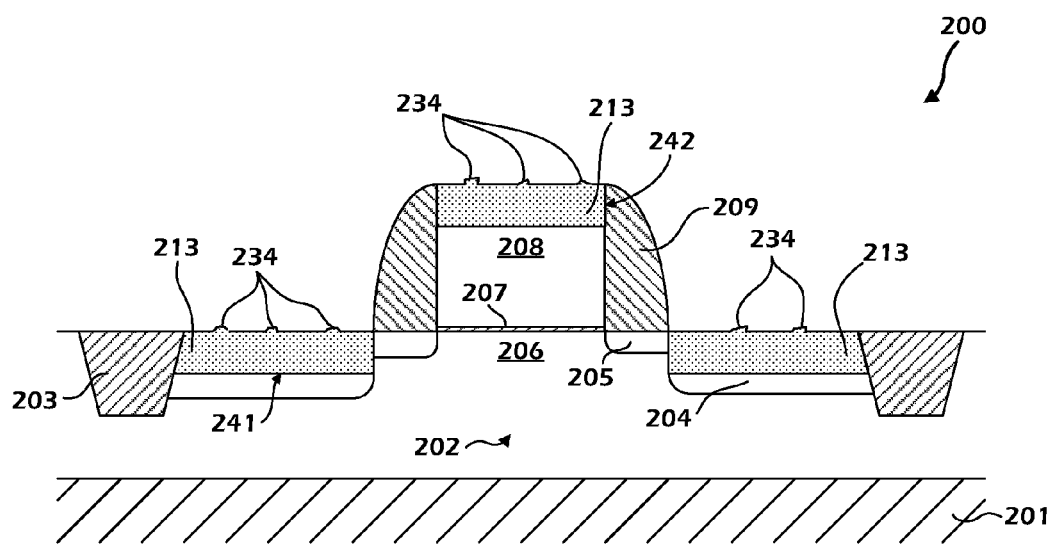

FIG. 2e schematically illustrates transistor 200 after completion of the selective etch process 232. The final nickel silicide layers 241 and 242 formed in the source/drain regions 204 and gate electrode 208 now substantially comprise nickel monosilicide 213, and layers 241, 242 may also contain raised silicide areas, or "protrusions" 234, which may be present above the locations where the "holes" 222 were intentionally formed during the cleaning process 230 (see FIGS. 2a-2b). While the "protrusions" 234 may slightly protrude above the surrounding surface of the active area 202, these "protrusions" 234 are not generally considered to be detrimental to the operational characteristics of the transistor 200.

Subsequent to the completion of the stripping process 232, further processing operations may be performed on transistor 200, such as forming metallization layers comprising interlayer dielectrics, conductive lines and contact vias, additional circuit elements, and the like. Furthermore, as result of the presently disclosed methods for forming metal silicide regions, the likelihood that defects such as contact "punch through" and the like may occur during device processing may be reduced as compared to metal silicide regions formed using prior art processes, such as the example discussed in the background section of this application. More specifically, a decrease in product yield attributable to contact "punch through" defects, which may be expected to be as high as 10% when forming metal silicide regions in accordance with the prior art process, may be as low as about 1% when employing methods in accordance with the subject defined by the present disclosure.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    depositing a first layer of a refractory metal on a surface of a silicon-containing material;
    performing a first heating process to convert at least a portion of said refractory metal to a metal silicide comprising monosilicides and disilicides of said refractory metal;
    performing a second heating process followed by a cleaning process after performing said first heating process to remove at least some of said disilicides from said metal silicide;
    depositing a second layer of said refractory metal above said silicon-containing material after performing said cleaning process; and
    performing a third heating process after depositing said second layer of said refractory metal.

2. The method of claim 1, wherein performing said first heating process comprises performing said first heating process to initiate a chemical reaction between said first layer of said refractory metal and said silicon-containing material, said chemical reaction forming said monosilicides and said disilicides of said refractory metal.

3. The method of claim 2, further comprising removing unreacted portions of said first layer of said refractory metal prior to performing said second heating process.

4. The method of claim 2, wherein performing said second heating process comprises performing said second heating process to transform said disilicides of said refractory metal to transformed monosilicides of said refractory metal.

5. The method of clam 1, wherein said cleaning process comprises performing an additional heating process after said second heating process and prior to said third heating process, and thereafter performing an etching process.

6. The method of claim 4, wherein performing said cleaning process comprises performing said cleaning process to selectively remove at least some of said transformed monosilicides, thereby leaving voids in said initial layer of metal silicide.

7. The method of claim 6, wherein depositing said second layer of said refractory metal comprises filling said voids.

8. The method of claim 1, wherein performing said third heating process comprises performing said third heating process to initiate a chemical reaction between said second layer of said refractory metal and said silicon-containing material, said chemical reaction forming a final layer of metal silicide comprising monosilicides of said refractory metal.

9. The method of claim 1, wherein said refractory metal comprises nickel.

10. The method of claim 9, wherein said refractory metal comprises platinum.

11. The method of claim 1, wherein performing at least one of said first, second and third heating processes comprises performing a rapid thermal annealing process.

12. The method of claim 5, wherein performing said additional heating process comprises performing a furnace annealing process.

13. A method, comprising:
    forming an initial metal silicide layer in a contact area of a semiconductor device, said initial metal silicide layer comprising a plurality of disilicide regions;
    removing at least some of said disilicide regions from said initial metal silicide layer by performing a heating process followed by a wet etching process to thereby create a plurality of voids in said initial metal silicide layer;
    depositing a layer of refractory metal above said contact area to cover said initial metal silicide layer and fill said voids;
    initiating a chemical reaction between said layer of said refractory metal and silicon in said contact area of said semiconductor device to form a final metal silicide layer in said contact area; and
    removing unreacted material of said layer of said refractory metal.

14. The method of claim 13, wherein side contact area comprises at least one of a source region, a drain region and a gate electrode of a transistor.

15. The method of claim 13, wherein said refractory metal comprises nickel.

16. The method of claim 15, wherein said refractory metal further comprises platinum.

17. The method of claim 13, wherein removing said at least some of said disilicide regions comprises transforming said disilicide regions to monosilicides of said refractory metal during a heat treatment process adapted to form said initial metal silicide layer and removing said transformed monosilicides.

18. The method of claim 13, wherein initiating said chemical reaction between said layer of said refractory metal and silicon in said contact area of said semiconductor device comprises performing a rapid thermal annealing process.

* * * * *